United States Patent [19]
Ishida et al.

[11] Patent Number: 5,846,870
[45] Date of Patent: Dec. 8, 1998

[54] METHOD OF MEASURING A SEMICONDUCTOR DEVICE AND A METHOD OF MAKING A SEMICONDUCTOR DEVICE

[75] Inventors: Tomoaki Ishida; Ryo Obara, both of Tokyo, Japan

[73] Assignee: Mitsubishi Denki Kabushiki Kaisha, Tokyo, Japan

[21] Appl. No.: 862,646

[22] Filed: May 23, 1997

[30] Foreign Application Priority Data

Nov. 29, 1996  [JP]  Japan ................................ 8-320035

[51] Int. Cl.⁶ .................................................. H01L 21/20
[52] U.S. Cl. .......................... 438/398; 438/255; 438/964
[58] Field of Search .................................. 438/255, 398, 438/964; 257/309

[56] References Cited

FOREIGN PATENT DOCUMENTS 4-207066  7/1992  Japan .
4-320370  11/1992  Japan .

*Primary Examiner*—Charles L. Bowers, Jr.
*Assistant Examiner*—Toniae M. Thomas
*Attorney, Agent, or Firm*—McDermott, Will & Emery

[57] ABSTRACT

A method of measuring a semiconductor device in forming a capacitor by successively laminating a dielectric film and an opposed electrode above an upper face of a charge storing electrode a surface of which is formed in an irregular shaper, including the steps of forming the irregular shape of the charge storing electrode and measuring an area of the charge storing electrode which is to constitute an effective area of the capacitor by an atomic force microscope.

7 Claims, 9 Drawing Sheets

- MEASURING STYLUS TIP ANGLE = 40°
- ○ MEASURING STYLUS TIP ANGLE = 30°
- □ MEASURING STYLUS TIP ANGLE = 15°

METHOD OF MEASURING A SEMICONDUCTOR DEVICE AND A METHOD OF MAKING A SEMICONDUCTOR DEVICE

BACKGROUND OF THE INVENTION

1. Field of the Invention

The present invention relates to a method of measuring a semiconductor device and a method of making a semiconductor device for controlling a method of fabricating a semiconductor when the device is made with an upper surface of a charge storing electrode of a capacitor formed in an irregular shape.

2. Discussion of Background

As one of semiconductor devices, there is a dynamic random access memory (hereinafter, abbreviated as DRAM) where a memory cell is constituted by an MOS (Metal Oxide Semiconductor) transistor and an MOS capacitor. According to such a DRAM storing of information is executed in accordance with whether a charge is stored in the MOS capacitor. Further, determination and reading of information is executed by a method where an electric charge of the MOS capacitor is discharged to a bit line via the MOS transistor and a potential change thereof is detected.

Figure 9:
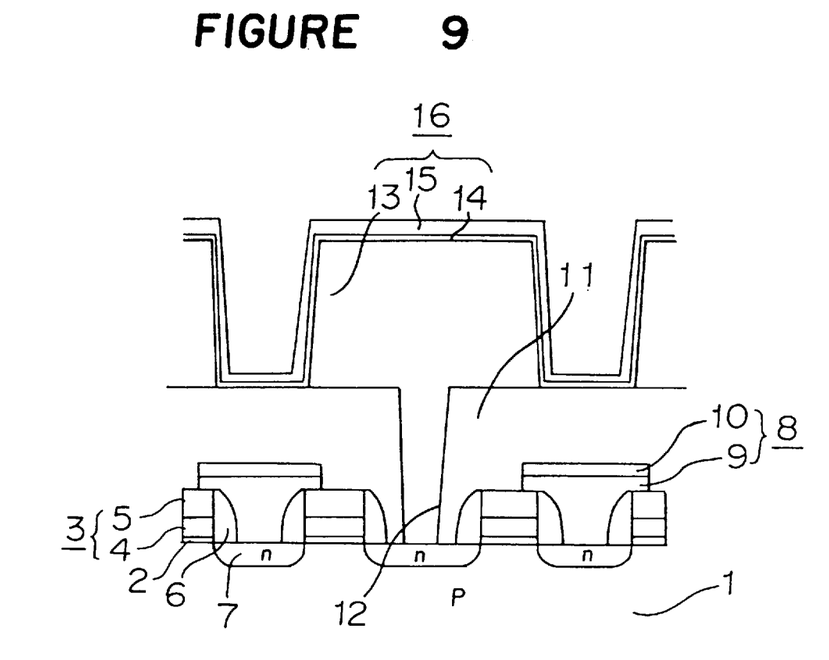
FIG. 9 is a sectional view showing the constitution of a conventional semiconductor device.

FIG. 9 is a sectional view showing a capacitor of a DRAM in a conventional semiconductor device. In FIG. 9, numeral 1 designates a silicon substrate, numeral 2 designates a gate oxide film formed on the silicon substrate 1, numeral 3 designates a gate electrode formed on the gate oxide film 2 and the gate electrode 3 is formed by successively laminating a polycrystal silicon film 4 and a high melting point metal silicide film 5. Numeral 6 designates side walls formed on side walls of the gate electrode 3 and the side wall 6 comprises a silicon oxide film for constituting an LDD (Light Doped Drain) structure.

Numeral 7 designates a source/drain region for a MOS transistor formed by ion implantation or the like, numeral 8 designates a bit line electrically connected to the source/drain region 7 between the gate electrodes 3 and the bit line 8 is formed by successively laminating a polycrystal silicon film 9 and a high melting point metal silicide film 10. Numeral 11 designates a silicon oxide film formed to cover the bit lines 8 and numeral 12 designates a contact hole perforated to reach the silicon substrate 1 in the silicon oxide film 11.

Numeral 13 designates a charge storing electrode formed to fill up the contact hole 12 and the charge storing electrode is electrically connected to the source/drain region 7. Numeral 14 designates a dielectric film laminated on the charge storing electrode 13 and the dielectric film 14 is formed by successively laminating, for example, silicon nitride films and silicon oxide films. Numeral 15 designates an opposed electrode laminated on the dielectric film 14 and numeral 16 designates a capacitor of a DRAM comprising the charge storing electrode 13, the dielectric film 14 and the opposed electrode 15.

In recent years, dense integration of DRAMs is rapidly carried out by the progress of the semiconductor technology. The biggest problem in the dense integration of DRAMs, is to ensure the capacitance of a capacitor while decreasing the area of a memory cell and to ensure the hold time of electric charge stored in a MOS capacitor. In order to achieve the object, there has been a recent technology where an electrode of a capacitor having a surface in an irregular shape is formed and the surface area of the electrode is increased by the irregular shape whereby the capacitance of the capacitor is increased.

Figure 10:
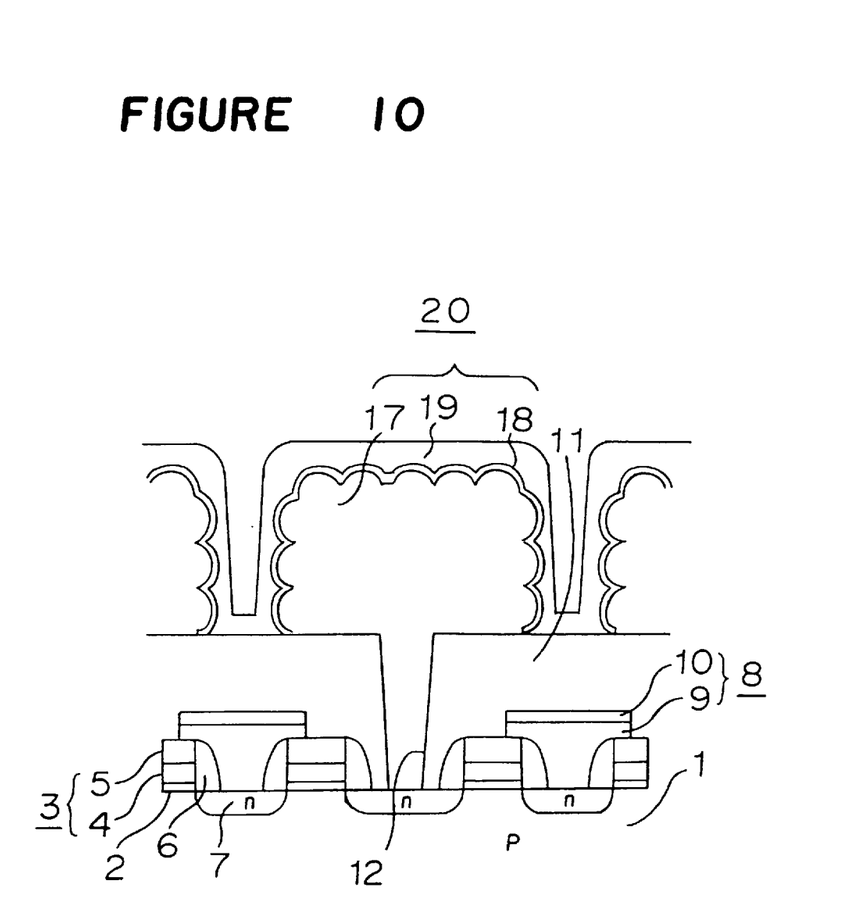
FIG. 10 is a sectional view showing the constitution of a conventional semiconductor device.
Figure 11A:
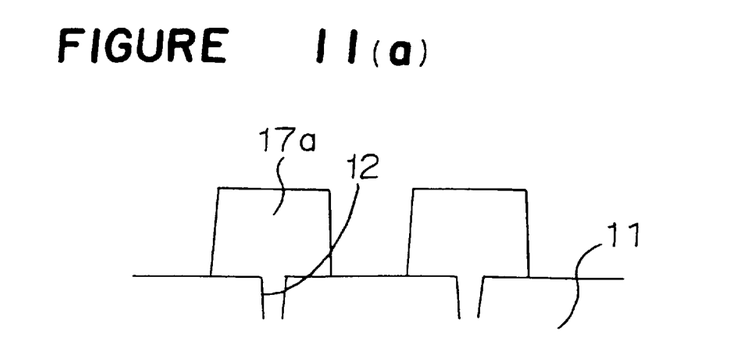
FIGS. 11(a), 11(b), 11(c) and 11(d) are sectional views partially showing a method of making a semiconductor device illustrated by FIG. 10.
Figure 11B:
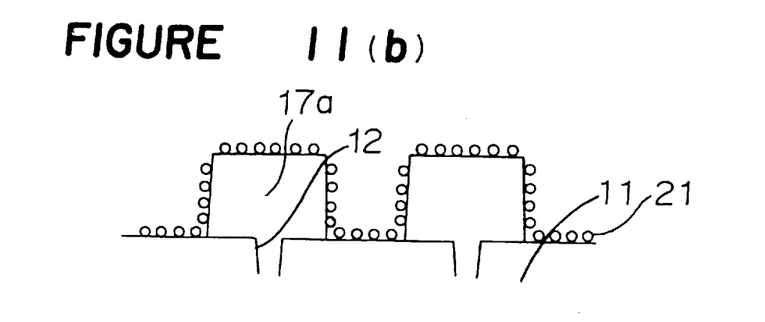
Figure 11C:
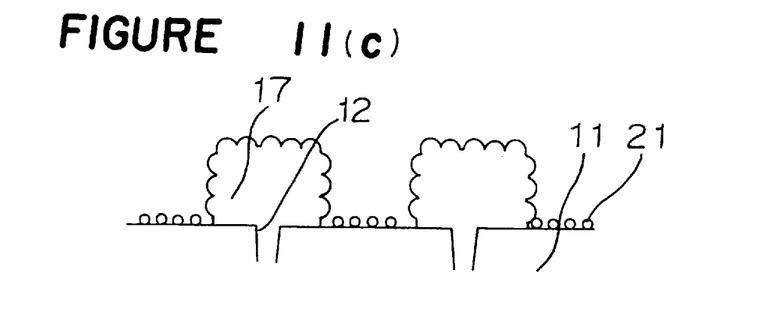
Figure 11D:
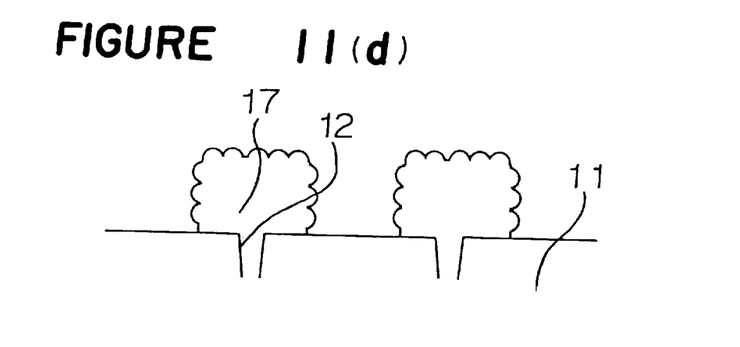

FIG. 10 is a sectional view showing the constitution of a capacitor having a surface in such a irregular shape. In FIG. 10, portions similar to those in the above-described conventional case are attached with the same notations and an explanation thereof will be omitted. Numeral 17 designates a charge storing electrode a surface of which is provided with an irregular shape and the electrode is formed by, for example, polycrystal silicon. Numeral 18 designates a dielectric film laminated on the charge storing electrode 17 and the dielectric film is formed by successively laminating, for example, silicon nitride films and silicon oxide films. Numeral 19 designates an opposed electrode laminated on the dielectric film 18 and numeral 20 designates a capacitor of a DRAM comprising the charge storing electrode 17, the dielectric film 18 and the opposed electrode 19.

By forming the surface of the charge storing electrode 17 in an irregular shape as described above, the effective area of the capacitor 20 is increased and the capacitance of the capacitor 20 is increased. Further, after completing the DRAM, the capacitance of a capacitor 20 is electrically measured, whether a measured value thereof is equal to a set value is determined and the product is shipped after ascertaining whether it is allowable or failed.

Generally, in fabricating DRAMs, a production period of one month is necessary after forming the capacitor 20 until a finished product is manufactured.

An explanation will be given of a method of making a conventional charge storing electrode 17 the surface of which is provided with an irregular shape in reference to FIGS. 11(a), 11(b), 11(c) and 11(d). Firstly, amorphous silicon doped with phosphor or the like is laminated to fill a contact hole 12 and is patterned whereby a matrix of the charge storing electrode 17a is formed (FIG. 11(a)). Next, silicon crystal nuclei 21 are formed over the entire surface by a CVD (Chemical Vapor Deposition) process using, for example, $Si_2H_2$ gas (FIG. 11(b)).

Next, a heat treatment is conducted by which the amorphous silicon is crystallized and grown with the silicon crystal nuclei 21 on the matrix of the charge storing electrode 17a as nuclei by which the charge storing electrode 17 having the surface of an irregular shape is formed. At this moment, the silicon oxide film 11 and the silicon crystal nuclei 21 do not react with each other and the silicon crystal nuclei 21 on the silicon oxide film 11 remain as they are (FIG. 11(c)).

The silicon crystal nuclei 21 per se are not complete insulators and therefore, if they remain as they are, there is a danger of electrically shortcircuitting the silicon nuclei 21 with the charge storing electrode 17. Therefore, an etch back operation is carried out over the entire surface by a dry etching process using, for example, a chlorine group gas plasma by which extra ones of the silicon crystal nuclei 21 formed on the silicon oxide film 11 are removed (FIG. 11(d)). As describe above, the process for forming the irregular shape of the surface of the charge storing electrode 17, is a complicated process requiring the three steps and is a process difficult to control where many process parameters are concerned.

Conventionally, the capacitance of the capacitor 20 has been increased in this way and the capacitance value of the capacitor 20 is directly concerned with a degree of the irregular shape (effective area increase rate) of the capacitor 20. Accordingly, the effective area increase rate is an important parameter determining the hold time of electric charge. That is, when the effective area increase rate is deviated from a design value, the deviation is directly concerned with failure of a product. However, as has been described, the process of forming the irregular shape of the surface of the charge storing electrode 17 is complicated and the control of the process is very difficult.

The conventional method of measuring a semiconductor device and the conventional method of making a semiconductor device are carried out as described above and the capacitance value of the capacitor 20 is electrically confirmed after a finished product has been formed. Accordingly, when a failure occurs, products ranging, for example, from finished products through semiproducts in the midst of forming capacitors, for example, products of one month are failed, which amounts to an enormous loss.

Also, the removing operation by etch back in respect of the silicon crystal nuclei 21 after forming the charge storing electrode 17 having the irregular shape, constitutes a complicated step having many conditions and therefore, the silicon crystal nuclei 21 remain which gives rise to electric shortcircuit between the silicon crystal nuclei 21 and the charge storing electrode 17, unless the process is controlled pertinently.

SUMMARY OF THE INVENTION

The present invention has been carried out in order to resolve the above-described problems and it is an object of the present invention to provide a method of measuring a semiconductor device and a method of making a semiconductor device capable of reducing dispersion in the method of measuring a semiconductor device and promoting the yield.

According to a first aspect of the present invention, there is provided a method of measuring a semiconductor device in forming a capacitor by successively laminating a dielectric film and an opposed electrode above an upper face of a charge storing electrode a surface of which is formed in an irregular shape, said method comprising the steps of:

forming the irregular shape of the charge storing electrode; and measuring an area of the charge storing electrode which is to constitute an effective area of the capacitor by an atomic force microscope.

According to a second aspect of the present invention, there is provided the method of measuring a semiconductor device according to the first aspect, wherein an angle of a tip of a measuring stylus of the atomic force microscope is set to 20° through 50°.

According to a third aspect of the present invention, there is provided the method of measuring a semiconductor device according to the first or the second aspects, wherein a measured object is a dummy charge storing electrode which has been formed simultaneously with formation of the charge storing electrode and a surface of which has been formed in the irregular shape.

According to a fourth aspect of the present invention, there is provided a method of making a semiconductor device comprising the steps of:

determining whether the measured value of the effective area of the charge storing electrode which has been measured by the method of measuring a semiconductor device according to any one of the first aspect through the third aspect, falls in a previously set range of a capacitance value of the capacitor;

determining that the measured value is abnormal if the measured value is out of the set range; and modifying conditions of forming the charge storing electrode in the step of forming the irregular shape of the charge storing electrode.

According to a fifth aspect of the present invention, there is provided a method of making a semiconductor device, wherein the step of forming the charge storing electrode the surface of which has been formed in the irregular shape according to the method of making a semiconductor described in the fourth aspect further comprises the steps of:

laminating an amorphous silicon on a silicon oxide film and patterning the amorphous silicon thereby forming a matrix of the charge storing electrode;

forming silicon crystal nuclei on entire surfaces of the silicon oxide film and the matrix of the charge storing electrode; and subjecting the matrix of the charge storing electrode and the silicon oxide film to a heat treatment thereby crystallizing the amorphous silicon and the silicon crystal nuclei.

According to a sixth aspect of the present invention, there is provided a method of making a semiconductor device comprising the steps of:

laminating an amorphous silicon on a silicon oxide film and patterning the amorphous silicon thereby forming a matrix of a charge storing electrode;

forming silicon crystal nuclei on entire surfaces of the silicon oxide film and the matrix of the charge storing electrode;

subjecting the silicon oxide film and the matrix of the charge storing electrode to a heat treatment thereby crystallizing the amorphous silicon and the silicon crystal nuclei of the matrix of the charge storing electrode whereby the surfaces are formed in an irregular shape;

measuring heights of the silicon crystal nuclei on the silicon oxide film by an atomic force microscope; and conducting an etch back operation of the silicon oxide nuclei.

According to a seventh aspect of the present invention, there is provided a method of making a semiconductor device comprising the steps of:

laminating an amorphous silicon on a silicon oxide film and patterning the amorphous silicon thereby forming a matrix of a charge storing electrode;

forming silicon crystal nuclei on entire surfaces of the silicon oxide film and the matrix of the charge storing electrode;

subjecting the silicon oxide film and the matrix of the charge storing electrode to a heat treatment thereby crystallizing the amorphous silicon and the silicon crystal nuclei of the matrix of the charge storing electrode whereby the surfaces are formed in an irregular shape;

removing the silicon crystal nuclei on the silicon oxide film by an etch back operation;

measuring heights of the silicon crystal nuclei remaining on the silicon oxide film by an atomic force microscope;

determining the heights of the silicon crystal nuclei as abnormal if the measured value is larger than a desired value; and modifying conditions of the step of removing the silicon crystal nuclei on the silicon oxide film by the etch back operation.

BRIEF DESCRIPTION OF THE DRAWINGS

FIGS. 2(*a*), 2(*b*), 2(*c*) and 2(*d*) are sectional views partially showing a method of making a semiconductor device illustrated by FIG. 1;

DETAILED DESCRIPTION OF PREFERRED EMBODIMENTS

An explanation will be given of embodiments of the present invention in reference to the drawings as follows.

EMBODIMENT 1

Figure 1:
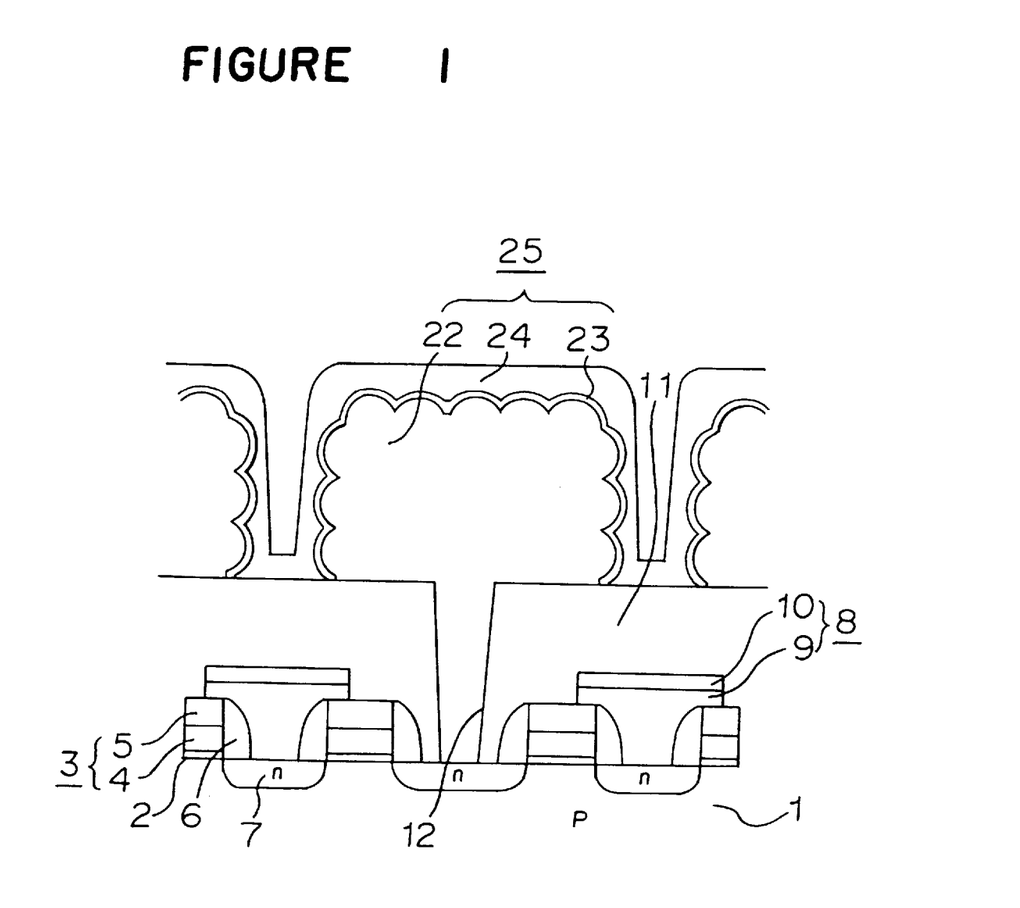
FIG. 1 a sectional view showing the constitution of a semiconductor device according to Embodiment 1 of the present invention.

FIG. 1 is a sectional view showing the constitution of a semiconductor device according to Embodiment 1 of the present invention. In FIG. 1, portions similar to those in the conventional examples are attached with the same notations and an explanation thereof will be omitted. Numeral 22 designates a charge storing electrode having a surface in an irregular shape and the charge storing electrode 22 is formed by, for example, polycrystal silicon. Numeral 23 designates a dielectric film laminated on the charge storing electrode 22 and the dielectric film 22 is formed by successively laminating, for example, silicon nitride films and silicon oxide films. Numeral 24 designates an opposed electrode laminated on the dielectric film 23, and numeral 25 designates a capacitor of a DRAM comprising the charge storing electrode 22, the dielectric film 23 and the opposed electrode 24.

An explanation will be given of Embodiment 1 of the present invention in reference to FIGS. 2(a), 2(b), 2(c), 2(d), 3, 4, 5, 6(a), 6(b), 7 and 8. Firstly, amorphous silicon doped with phosphor or the like is laminated to fill the contact hole 12 and patterned by which a matrix of the charge storing electrode 22a is formed similar to the conventional example (FIG. 2(a) and Step S1 of FIG. 3). Next, silicon crystal nuclei 26 are formed on the entire face by a CVD process using, for example, $Si_2H_2$ gas (FIG. 2(b) and Step S2 of FIG. 3).

Next, a heat treatment is conducted by which the amorphous silicon is crystallized and grown with silicon crystal nuclei 26 on the matrix of the charge storing electrode 22a as nuclei whereby the charge storing electrode 22 having a surface of an irregular shape is formed. At this moment, the silicon oxide film 11 and the silicon crystal nuclei 26 do not react with each other and the silicon crystal nuclei 26 on the silicon oxide film 11 remain as they are (FIG. 2(c) and Step S2 of FIG. 3).

Figure 4:
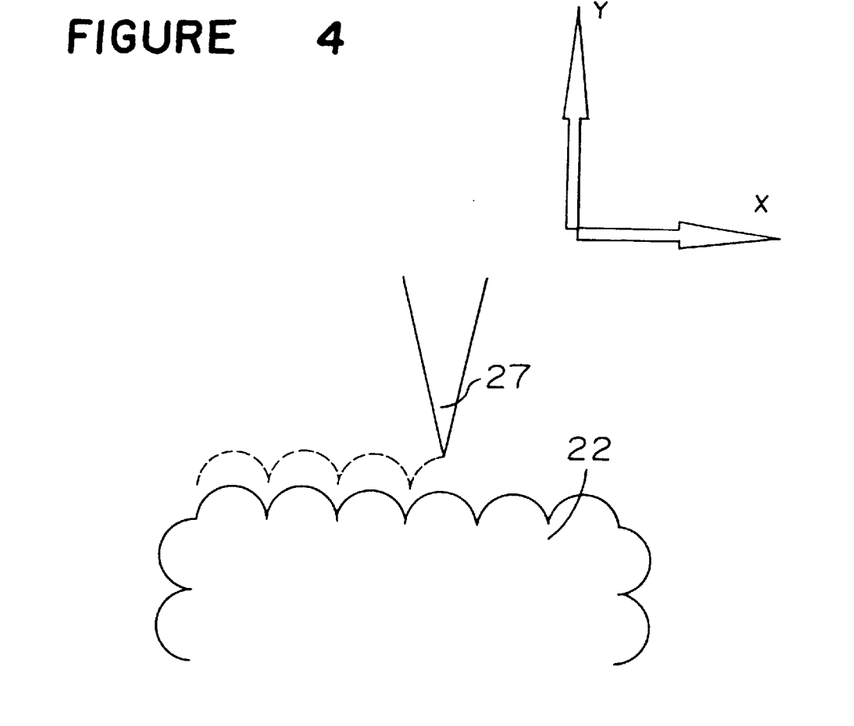
FIG. 4 is a view showing a method of measurement by an AFM (Atomic Force Microscope) according to Embodiment 1 of the present invention.

Further, a constant distance of the surface of the charge storing electrode 22 is scanned by using an atomic force microscope (abbreviated as AFM) by which an actual surface area is measured. According to the measuring method, as illustrated by FIG. 4, a measuring stylus 27 of the AFM is firstly made to approach the charge storing electrode 22 to reach a distance of approximately 5 nm therefrom. An interatomic force caused between the measuring stylus 27 and the charge storing electrode 22 is detected at this stage.

The interatomic force depends on the distance between the charge storing electrode 22 and the measuring stylus 27. Now, the measuring stylus 27 is moved in X-direction of FIG. 4 while controlling a Y-direction drive system in the drawing by a servo control such that the interatomic force stays constant. Then, the noncontact scanning of the measuring stylus 27 can be carried out as shown by a dotted line in the drawing along the irregular shape of the surface of the charge storing electrode 22.

At this moment, a distance of an actual movement of the measuring stylus 27 is calculated by processing a servo signal of the measuring stylus 27 in the drive systems in X-direction and Y-direction. Further, the distance is divided by a linear distance from a start point of measurement to a finish point thereof by which the surface area of the charge storing electrode 22 is measured and an area increase rate is calculated. Moreover, in order to carry out a further accurate measurement, for example, a constant area is divided into a plurality of portions at constant intervals, measurement of the plural divided portions is repeated and an average value of the measured values is calculated.

As such a method, an example where, for example, a square of 2 μm is divided into around 128 portions, is conceivable. In this case, the size of the actual charge storing electrode 22 is finely downsized to 1 μm or less. Therefore, in respect of the measurement, a method where a dummy charge storing electrode having a size of approximately 2 μm is formed simultaneously with the formation of the charge storing electrode 22 and the dummy charge storing electrode is utilized in the measurement, is conceivable.

Next, if the area increase rate which has been detected as described above, is within a range of a design value, the operation proceeds to the next step. Further, if the area increase rate is out of the range, the result is detected as abnormal, the fabrication is stopped and the failure is fed back to the steps of formation and heat treatment of the silicon crystal nuclei 26 and the respective steps are checked (Step S3 in FIG. 3).

When the AFM is used as described above, it is generally self-evident that the smaller the angle of the tip of the measuring stylus 27, the more promoted is the spatial resolution of the AFM measuring system, of which many research reports were issued in the past. Accordingly, it was considered that sharpening of the angle of the tip of the measuring stylus 27 was advantageous. However, when the angle is actually sharpened excessively, a phenomenon where the area increase rate of the charge storing electrode measured by the AFM does not coincide with the capacitance increase rate which is calculated by a capacitance value that is electrically measured in respect of a capacitor of an actual DRAM, is observed.

Figure 5:
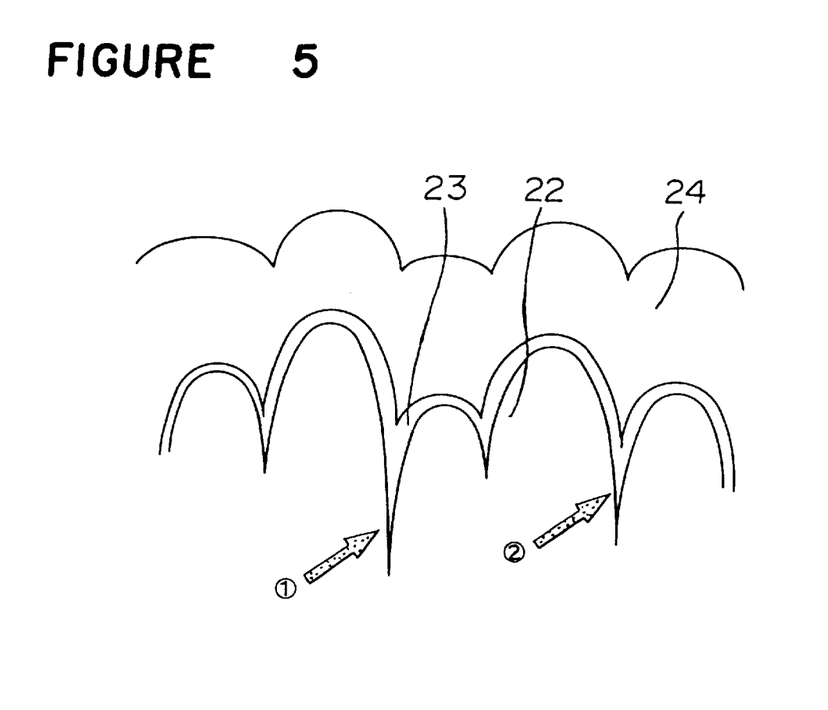
FIG. 5 is a partially enlarged sectional view of a capacitor of the semiconductor device illustrated by FIG. 1.

The phenomenon will be verified as follows. As shown by FIG. 5, the irregular shape of the actual charge storing electrode 22 is not uniform and a number of very narrow valley portions indicated by an arrow mark 1 and an arrow mark 2 are present. Further, the dielectric film 23 and the opposed electrode 24 each having a thickness of, for example, about 80 Å are successively formed on top of the charge storing electrode 22 by which the valley portions are filled by the dielectric film 23 and it is found that the portions do not effectively function as capacitors.

Figure 6A:
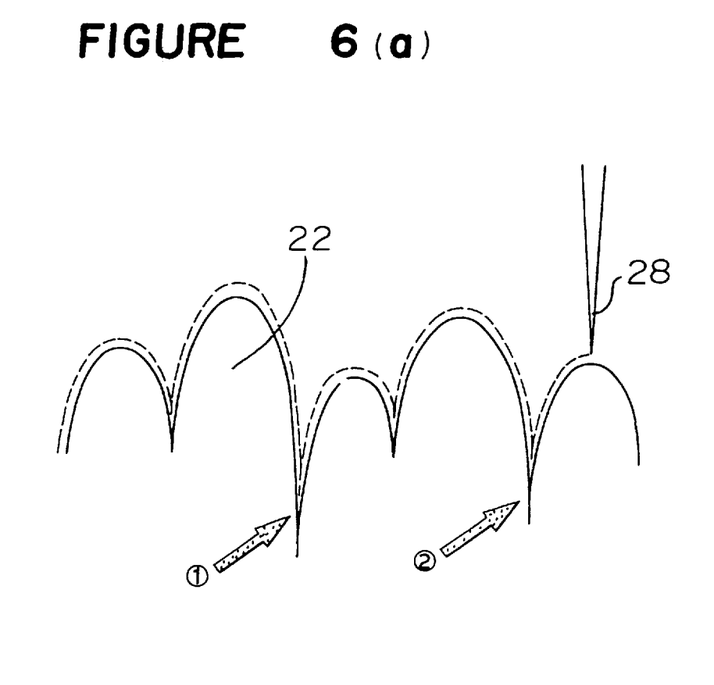
FIGS. 6(a) and 6(b) are views showing a method of measuring a semiconductor device in respect of a difference in an angle of a tip of a measuring stylus of the AFM according to Embodiment 1 of the present invention.
Figure 6B:
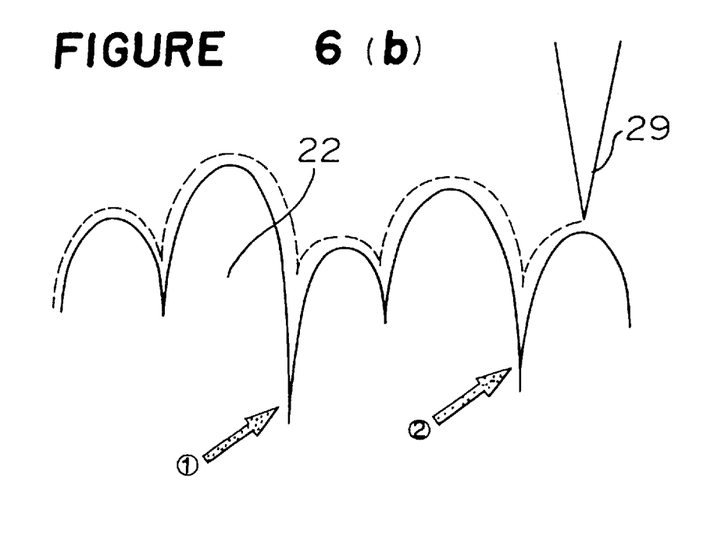

It is conceivable that when the valley portions which do not function effectively, are detected by the AFM as area increase portions, the phenomenon where the area increase rate and the capacitance increase rate do not coincide with each other, occurs. If the measurement is conducted by using a measuring stylus 28 having a small tip angle as illustrated by FIG. 6(a), the valley portions of the charge storing electrode 22 are also measured. If the measurement is conducted by a measuring stylus 29 having a large tip angle, the valley portions of the charge storing electrode 22 are not measured by which only an upper face of the dielectric film 23, that is, only an area in correspondence with the effective area as the capacitor can be measured.

It was found by the above-described observation that the tip angle of the measuring stylus is an important parameter in the measurement by the AFM. Accordingly, various angles of tip of the measuring stylus were set, and the area increase rate of the charge storing electrode 22 was compared with the capacitance increase rates which were electrically measured in respect of a capacitor of an actual DRAM.

Five kinds of samples of the charge storing electrodes 22 having different irregular shapes were prepared, three kinds of styli having the tip angles of 15°, 30° and 40° were prepared and the measurement was conducted. Then, a result shown by FIGS. 7 was obtained. As apparent from FIG. 7, when the tip angle of the measuring stylus is 30° or 40°, a proportional relationship is maintained between a measured area increase rate of the AFM and the capacitance increase rate of the actual capacitor although more or less error is included. (Incidentally, the coefficient of proportion in respect of the measurement result of a large tip angle of 40° is smaller than that of the measurement in respect of a tip angle of 30° since the spatial resolution of the AFM measurement is decreased with an increase in the tip angle of the measuring stylus).

Figure 7:
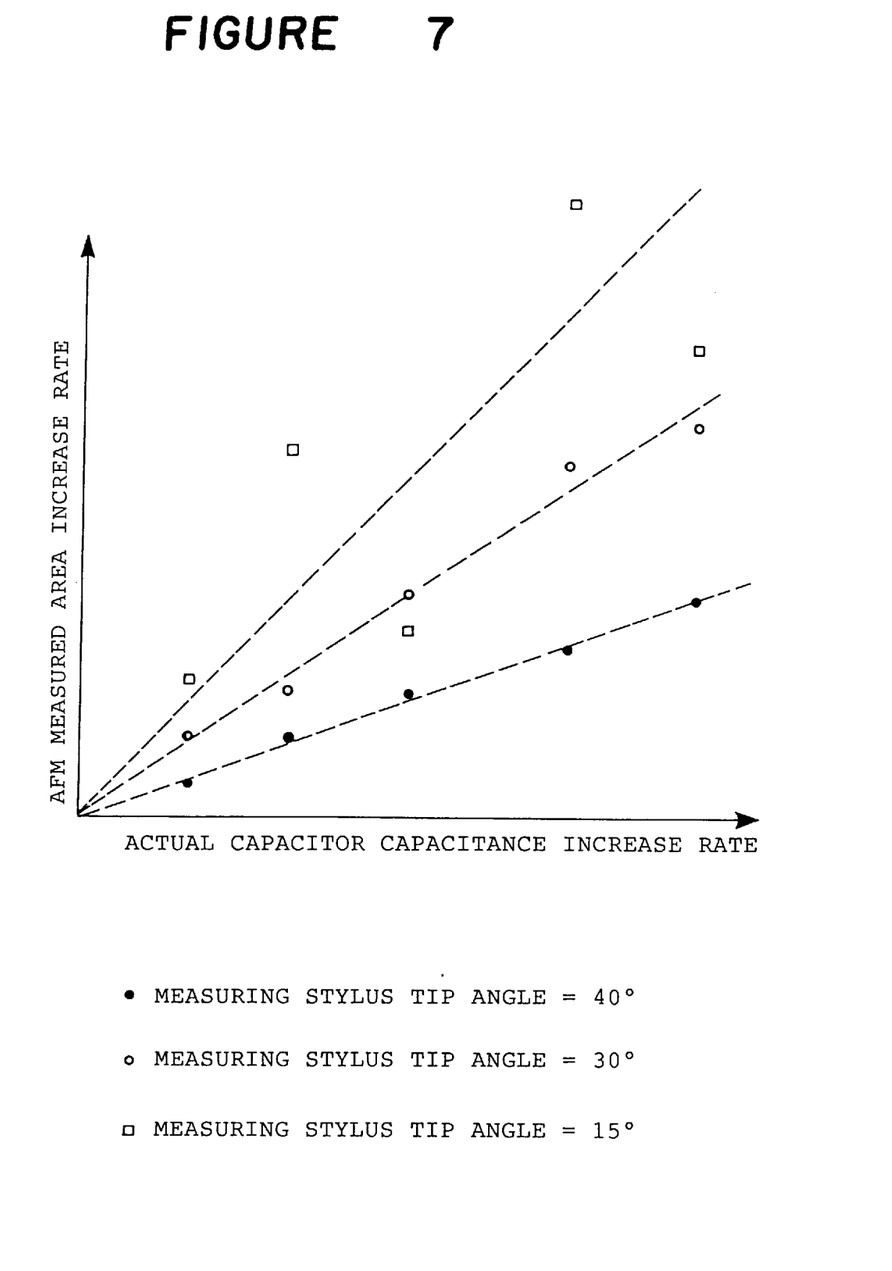
FIG. 7 is a diagram showing a relationship between an AFM measured area increase rate and an actual capacitor capacitance increase rate when the angle of the tip of the measuring stylus of the AFM according to Embodiment 1 of the present invention is charged.

However, when the tip angle was 15°, the relationship between the both did not constitute a proportional relationship but a measurement result having a very large dispersion was obtained. It is conceivable that an appropriate range of the tip angle of the measuring stylus of the AFM is from 20° through 50° by summarizing the experimental results and the characteristic of the AFM. It has been verified that an area in correspondence with the effective area of the capacitor 25 can be measured by measuring the upper face of the charge storing electrode 22 by an AFM having the measuring stylus with an angle of either of these.

Next, silicon crystal nuclei 26 are to be removed by the reason similar to that in the above-described conventional case.

Figure 3:
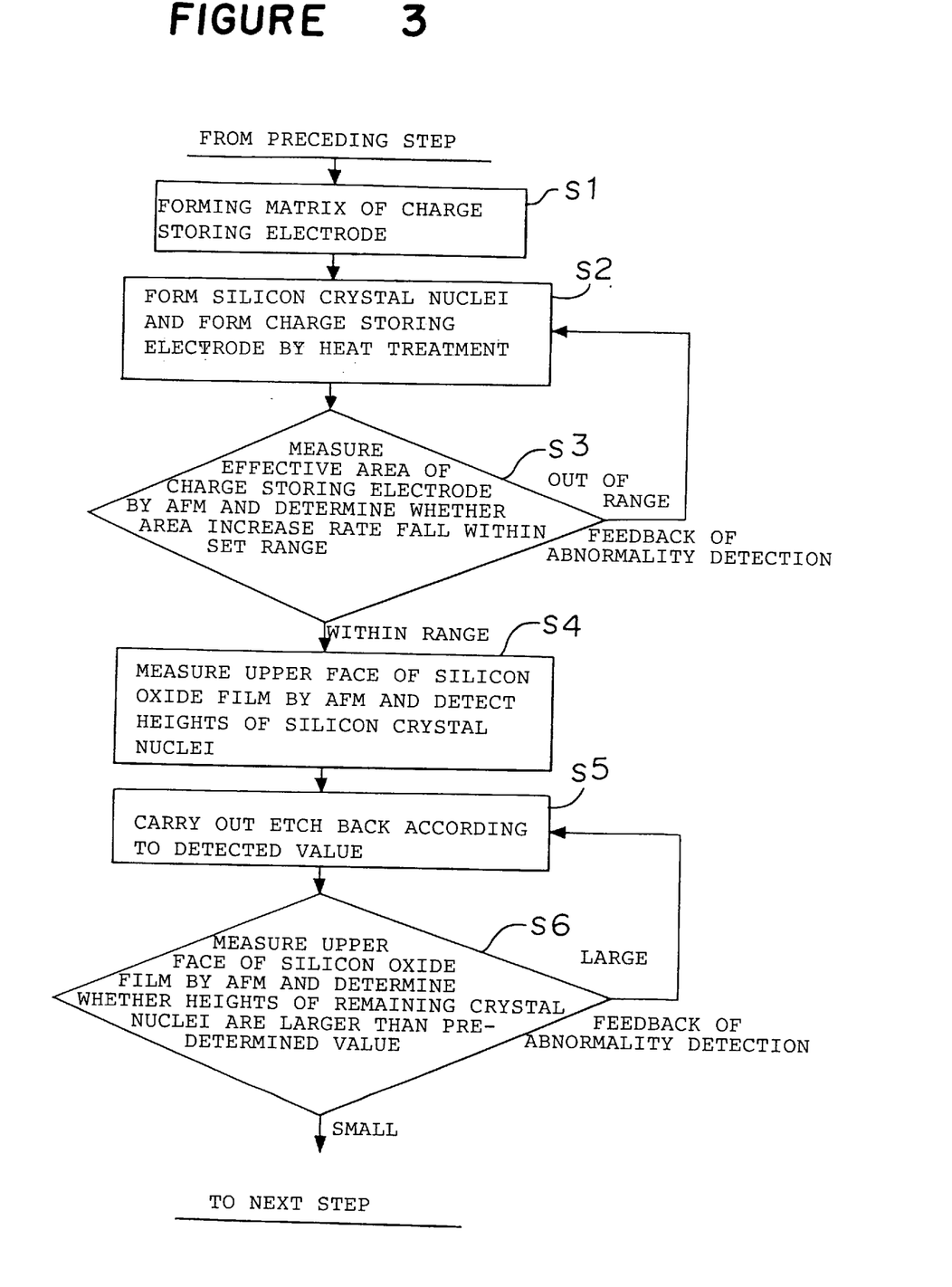
FIG. 3 is a diagram showing a flow chart of a method of making a semiconductor device illustrated by FIGS. 2(*a*), 2(*b*), 2(*c*) and 2(*d*)
Figure 8:
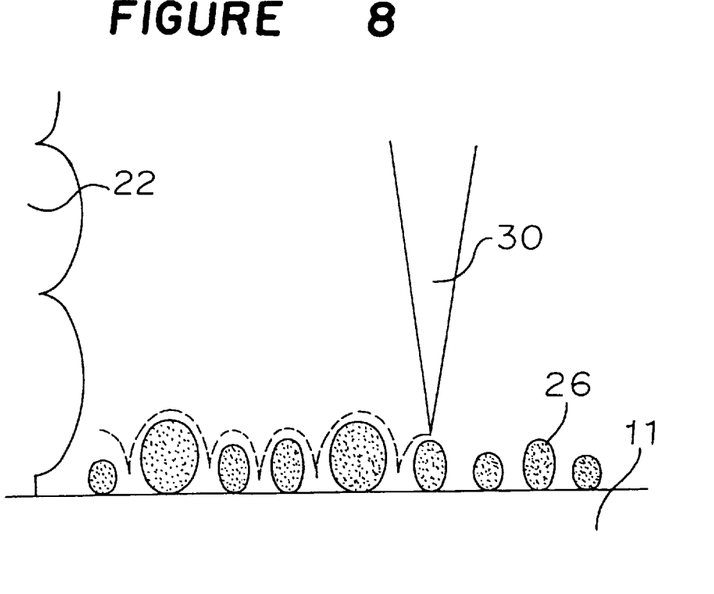
FIG. 8 is a view showing the measuring method of the AFM according to Embodiment 1 of the present invention.

Firstly, as shown by FIG. 8 the upper face of the silicon oxide film 11 is measured by a measuring stylus 30 of an AFM by which heights of the silicon crystal nuclei 26 are detected (Step S4 of FIG. 3). The AFM used here is different from those used in the above-described operations and the smaller the angle of the measuring stylus 30, the better for promoting the spatial resolution of the measuring system of the AFM.

Figure 2A:
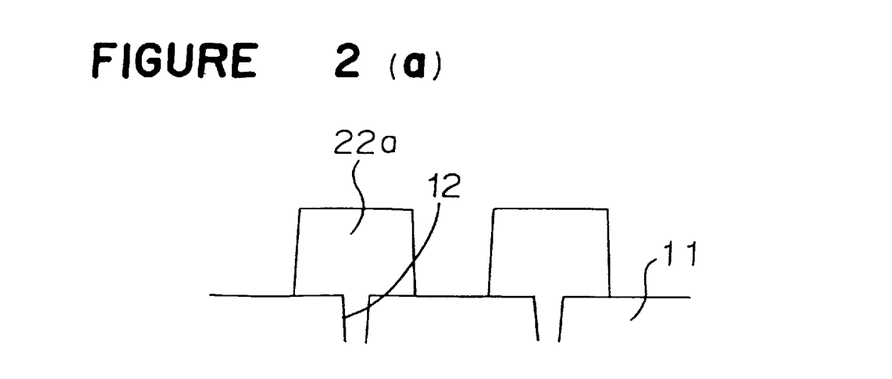
Figure 2B:
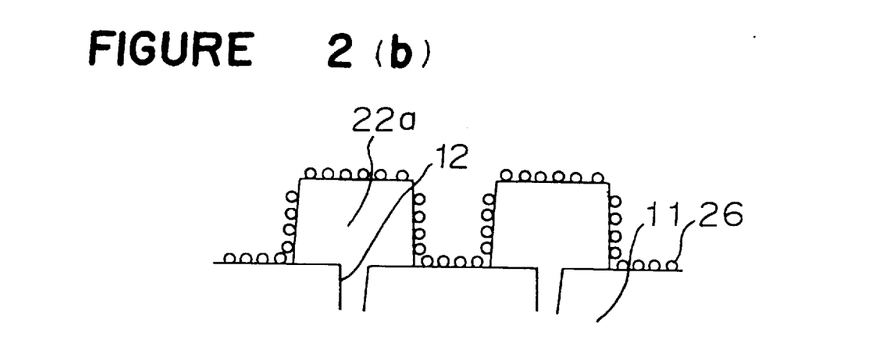
Figure 2C:
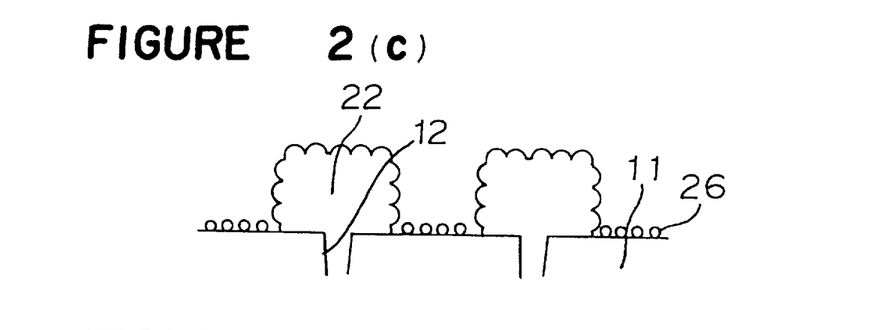
Figure 2D:
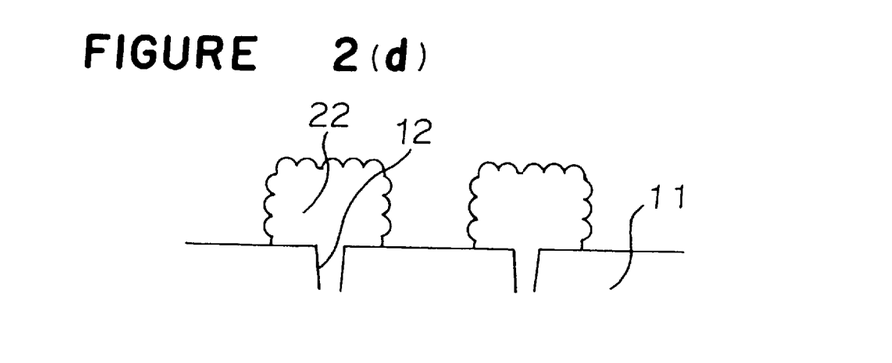

Next, an etch back operation of the entire face is carried out by a dry etching process using, for example, a chloride group gas plasma in accordance with the detected values by which extra ones of the silicon crystal nuclei 26 formed on the silicon oxide film 11 are removed (FIG. 2(d) and Step S5 of FIG. 3). Next, the upper face of the silicon oxide film 11 is measured again by the AFM, the heights of the remaining silicon crystal nuclei are detected and whether the values are larger than a desired value is determined (Step S6 of FIG. 3).

Then, if the heights are larger than the desired value, the result is detected as abnormal, the production is stopped, the detected abnormality is fed back to the etch bask step and the etch back step is checked. Further, when the heights are determined to be smaller than the desired value, the operation proceeds to the next step.

According to the method of measuring a semiconductor device and the method of making a semiconductor device of Embodiment 1 which have been carried out as described above, the area which is to constitute the effective area of the capacitor 25 can be detected immediately after forming the charge storing electrode 22 and whether the value falls in the set range of the capacitance value of the capacitor 25 can be determined. Also, the silicon crystal nuclei 26 can be removed accurately and can be detected firmly and therefore, the dispersion in the method of making a semiconductor device is reduced whereby the yield can be promoted.

Incidentally, although an example of the method of forming the irregular shape of the charge storing electrode 22 has been described in Embodiment 1, the invention is not limited to this method but even in the case where the irregular shape is formed by other method, the irregular shape of the charge storing electrode 22 may be measured by an AFM similar to Embodiment 1 whereby a similar effect can be achieved.

As described above, according to the first aspect of the present invention, when the capacitor is formed by successively laminating the dielectric film and the opposed electrode above the upper face of the charge storing electrode the surface of which is formed in an irregular shape, after forming the irregular shape of the charge storing electrode, the area which is to constitute the effective area of the capacitor of the charge storing electrode is measured by using an atomic force microscope. Accordingly, the method of measuring a semiconductor device capable of measuring the area which is to constitute the effective area of the capacitor after forming the irregular shape of the charge storing electrode can be provided.

According to the second aspect of the present invention, the angle of the tip of the measuring stylus of the atomic force microscope is set to 20° through 50°. Accordingly, the method of measuring a semiconductor device capable of precisely measuring the area which is to constitute the effective area of the capacitor above the charge storing electrode can be provided.

According to the third aspect of the present invention, a dummy charge storing electrode the surface of which is formed in an irregular shape and which is formed simultaneously with formation of the charge storing electrode, constitutes a measured object. Accordingly, the method of measuring a semiconductor device capable of precisely measuring the area which is to constitute the effective area of the capacitor above the charge storing electrode can be provided.

According to the fourth aspect of the present invention, whether the measured value which is to constitute the effective area of the charge storing electrode and which has been measured by the method of measuring a semiconductor device in accordance with either of the first through the third aspects, falls in the previously determined set range of the capacitance value of the capacitor, is determined, the measured value is determined as abnormal when it is out of the set range and conditions of forming in the steps of forming the irregular shape of the charge storing electrode are modified. Accordingly, the method of making a semiconductor device capable of determining whether the steps of forming the irregular shape are normal or not at a time point where the irregular shape of the charge storing electrode has been formed, can be provided.

According to the fifth aspect of the present invention, in respect of the formation of the charge storing electrode the surface of which is formed in an irregular shape in accordance with the method of making a semiconductor device of the fourth aspect, the amorphous silicon is laminated on the silicon oxide film and patterned whereby a matrix of the charge storing electrode is formed, the silicon nuclei are formed on the entire faces of the silicon oxide film and the matrix of the charge storing electrode and the amorphous silicon and the silicon crystal nuclei on the matrix of the charge storing electrode are crystallized by performing a heat treatment. Accordingly, the method of making a semiconductor device capable of firmly forming the irregular shape of the charge storing electrode can be provided.

According to the sixth aspect of the present invention, the amorphous silicon is laminated on the silicon oxide film and patterned by which the matrix of the charge storing electrode is formed, the silicon crystal nuclei are formed on the entire faces of the silicon oxide film and the matrix of the charge storing electrode, the amorphous silicon and the silicon crystal nuclei on the matrix of the charge storing electrode are crystallized by conducting a heat treatment by which the charge storing electrode the surface of which is constituted in the irregular shape is formed, the heights of the silicon crystal nuclei on the silicon oxide film are measured by using an atomic force microscope and the etch back operation of the silicon crystal nuclei is carried out in accordance with the measured value. Therefore, the method of making a semiconductor device capable of firmly setting conditions of the etch back operation for removing the silicon crystal nuclei can be provided.

According to the seventh aspect of the present invention, the amorphous silicon is laminated on the silicon oxide film and patterned, whereby the matrix of the charge storing electrode is formed, the silicon crystal nuclei are formed on the entire faces of the silicon oxide film and the matrix of the charge storing electrode, the amorphous silicon and the silicon crystal nuclei on the matrix of the charge storing electrode are crystallized by conducting a heat treatment by which the charge storing electrode the surface of which is constituted in an irregular shape is formed, the silicon crystal nuclei on the silicon oxide film are removed by the etch back operation, the heights of the silicon nuclei remaining on the silicon oxide film are measured by using an atomic force microscope, when the measured values are larger than the desired value, the heights are determined as abnormal and conditions of the etch back operation step are modified. Accordingly, the method of making a semiconductor device capable of determining whether the step of etch back operation is normal or not can be provided.

What is claimed is:

1. A method of measuring a semiconductor device in forming a capacitor by successively laminating a dielectric film and an opposed electrode above an upper face of a charge storing electrode a surface of which is formed in an irregular shape, said method comprising the steps of:

forming the irregular shape of the charge storing electrode; and measuring an area of the charge storing electrode which is to constitute an effective area of the capacitor by an atomic force microscope.

2. The method of measuring a semiconductor device according to claim 1, wherein an angle of a tip of a measuring stylus of the atomic force microscope is set to 20° through 50°.

3. The method of measuring a semiconductor device according to claim 1, wherein a measured object is a dummy charge storing electrode which has been formed simultaneously with formation of the charge storing electrode and a surface of which has been formed in the irregular shape.

4. A method of making a semiconductor device comprising the steps of:

determining whether the measured value of the effective area of the charge storing electrode which has been measured by the method of measuring a semiconductor device according to any one of claim 1, falls in a previously set range of a capacitance value of the capacitor;

determining that the measured value is abnormal if the measured value is out of the set range; and modifying conditions of forming the charge storing electrode in the step of forming the irregular shape of the charge storing electrode.

5. The method of making a semiconductor device according to claim 4, wherein the step of forming the charge storing electrode the surface of which has been formed in the irregular shape according to the method of making a semiconductor described in claim 4 further comprises the steps of:

laminating an amorphous silicon on a silicon oxide film and patterning the amorphous silicon thereby forming a matrix of the charge storing electrode;

forming silicon crystal nuclei on entire surfaces of the silicon oxide film and the matrix of the charge storing electrode; and subjecting the matrix of the charge storing electrode and the silicon oxide film to a heat treatment thereby crystallizing the amorphous silicon and the silicon crystal nuclei.

6. A method of making a semiconductor device comprising:

a first step of laminating an amorphous silicon on a silicon oxide film and patterning the amorphous silicon thereby forming a matrix of a charge storing electrode;

a second step of forming silicon crystal nuclei on entire surfaces of the silicon oxide film and the matrix of the charge storing electrode;

a third step of subjecting the silicon oxide film and the matrix of the charge storing electrode to a heat treatment thereby crystallizing the amorphous silicon and the silicon crystal nuclei of the matrix of the charge storing electrode whereby the surfaces are formed in an irregular shape;

a fourth step of measuring heights of the silicon crystal nuclei on the silicon oxide film by an atomic force microscope; and a fifth step of conducting an etch back operation of the silicon crystal nuclei.

7. The method of making a semiconductor device, further comprising the steps of:

removing the silicon crystal nuclei on the silicon oxide film by an etch back operation successive to the third step of claim 6 instead of the fourth and the fifth steps of claim 6;

measuring heights of the silicon crystal nuclei remaining on the silicon oxide film by an atomic force microscope;

determining the heights of the silicon crystal nuclei as abnormal if the measured value is larger than a desired value; and modifying conditions of the step of removing the silicon crystal nuclei on the silicon oxide film by the etch back operation.

* * * * *